US008384882B2

(12) United States Patent
Compen et al.

(10) Patent No.: US 8,384,882 B2
(45) Date of Patent: Feb. 26, 2013

(54) CALIBRATION METHOD AND LITHOGRAPHIC APPARATUS FOR CALIBRATING AN OPTIMUM TAKE OVER HEIGHT OF A SUBSTRATE

(75) Inventors: Rene Theodorus Petrus Compen, Valkenswaard (NL); Gerardus Petrus Matthijs Van Nunen, Berghem (NL); Martijn Houben, 's-Hertogenbosch (NL); Marco Adrianus Peter Van Den Heuvel, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 632 days.

(21) Appl. No.: 12/580,066

(22) Filed: Oct. 15, 2009

(65) Prior Publication Data
US 2010/0110408 A1 May 6, 2010

Related U.S. Application Data

(60) Provisional application No. 61/110,444, filed on Oct. 31, 2008.

(51) Int. Cl.
G03B 27/32 (2006.01)
G03B 27/58 (2006.01)
(52) U.S. Cl. ............................................. 355/77; 355/72
(58) Field of Classification Search .................. 355/72
See application file for complete search history.

(56) References Cited

U.S. PATENT DOCUMENTS 6,231,716 B1 * 5/2001 White et al. ............. 156/345.54
6,654,096 B1 * 11/2003 Fujita et al. ..................... 355/52
7,161,663 B2 * 1/2007 Mertens et al. .................. 355/72

FOREIGN PATENT DOCUMENTS

| JP | 63-028035 | | 2/1988 |
| JP | 08-162390 | | 6/1996 |
| JP | 2006-344675 | | 12/2006 |
| JP | 2007-042924 | | 2/2007 |
| JP | 2008-198755 | | 8/2008 |
| JP | 2008198755 A | * | 8/2008 |

OTHER PUBLICATIONS

English language translation of JP2008-198755, published on Aug. 28, 2008.*
Japanese Office Action mailed Dec. 8, 2011 in corresponding Japanese Patent Application No. 2009-244037.

* cited by examiner

*Primary Examiner* — Toan Ton
*Assistant Examiner* — Michelle Iacoletti
(74) *Attorney, Agent, or Firm* — Pillsbury Winthrop Shaw Pittman LLP (57) ABSTRACT

A calibration method for calibrating an optimum take over height of a substrate in a lithographic apparatus between a substrate table and an ejector element moveable to load and unload the substrate from the substrate table, the method including clamping the substrate on one of the substrate table and ejector element; moving the ejector element between an unloaded state wherein the substrate is supported by the substrate table and a loaded state wherein the substrate is at least partly supported by the ejector element; determining a reference height of the ejector element at the moment that the weight of the substrate is at least partly taken over between the substrate table and the ejector element; and determining the optimum take over height for the ejector element from the determined reference height.

20 Claims, 9 Drawing Sheets

CALIBRATION METHOD AND LITHOGRAPHIC APPARATUS FOR CALIBRATING AN OPTIMUM TAKE OVER HEIGHT OF A SUBSTRATE

CROSS REFERENCE TO RELATED APPLICATIONS

This application claims priority and benefit under 35 U.S.C. §119(e) to U.S. Provisional Patent Application No. 61/110,444, entitled "Calibration Method and Lithographic Apparatus For Calibrating An Optimum Take Over Height Of A Substrate", filed on Oct. 31, 2008. The content of that application is incorporated herein in its entirety by reference.

FIELD

The present invention relates to a calibration method for calibrating an optimum take over height of a substrate between a substrate table and ejector elements thereof, and to a lithographic apparatus having a control unit to perform such a calibration method.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

A lithographic apparatus includes a substrate table onto which the substrate is to be accurately loaded before starting the actual transfer of a pattern on the substrate. The substrate may be loaded onto the table by first placing it on a set of three slender ejector pins upwardly projecting out of holes which are provided in the table. These pins are constructed so as to be moveable in the vertical Z-direction, that is to say in a direction perpendicular to the upper surface of the substrate and/or the table, commonly indicated as the X, Y plane. The pins are connected to one another and their up- and downward moving takes place using a common drive. After the substrate is placed on the pins, they are lowered until the substrate is attracted by vacuum device (e.g. a vacuum pump) integrated in the table. After that, the pins are further lowered until the substrate is fully supported by the table and clamped thereon. The substrate is then no longer supported by the pins.

Offsets and tilts in the loading of the substrates may have a negative impact on the overlay during the transfer of the pattern. It has also been found that mere is some significant spread in how the substrate is loaded to the table between different chucks for holding the substrate table.

In order to be able to improve the loading process of the substrate, and in particular to compensate for the effects of imperfections in the construction of the ejector pins relative to the table, a calibration process may be performed. From this calibration process, an optimum take over height for the substrate to be taken over from the ejector pins by the substrate table may be determined and vice versa. Also, a possible tilt of the pins with respect to the table may be corrected via a tilt calibration.

The height calibration is currently done as follows: the vacuum of the substrate table is switched on, and the pins with the substrate supported thereon are lowered stepwise. When the substrate has come at a certain distance from the table, it is pulled by the vacuum towards the table. This causes a change in the vacuum forces, which change is detected. The moment of change of the vacuum forces is then reduced to the height of the ejector pins at that moment. This height can be subtracted with a predefined offset from a calibration starting height in order to obtain the required optimum take over height.

This present calibration method for determining the optimum take over height has a limited accuracy, in particular to about 0.2-0.3 mm.

The present tilt calibration is currently done with the aid of a mechanical tool. The accuracy of this mechanical tilt correction is also limited, and in practice has appeared to be about 300 μrad.

SUMMARY

It is desirable to provide an improved calibration method.

According to an embodiment of the invention, there is provided a lithographic apparatus and a calibration method for calibrating an optimum take over height of a substrate in such a lithographic apparatus between a substrate table and at least one ejector element which is moveable for loading and unloading the substrate from the substrate table, the method including clamping the substrate on one of the substrate table and ejector element; moving the ejector element between an unloaded state wherein the substrate is supported by the substrate table and a loaded state wherein the substrate is at least partly supported by the ejector element; determining a reference height of the ejector element at the moment that the weight of the substrate is at least partly taken over between the substrate table and the ejector element; and determining the optimum take over height for the ejector element from the determined reference height, wherein the reference height is determined based on the quantifiable difference in velocity of the ejector element when moved between its unloaded and loaded state, during which movement the ejector element partly moves with a first velocity in its unloaded state, and partly moves with a second velocity in its loaded state, and wherein a discontinuity between the first and second velocity determines the reference height.

In another embodiment of the invention, there is provided a lithographic apparatus and a calibration method for calibrating an optimum take over height of a substrate in such a lithographic apparatus between a substrate table and at least one ejector element which is moveable for loading and unloading the substrate from the substrate table, the method including: clamping the substrate on one of the substrate table and ejector element; moving the ejector element between an unloaded state wherein the substrate is supported by the substrate table and a loaded state wherein the substrate is at least partly supported by the ejector element; determining a reference height of the ejector element at the moment that the weight of the substrate is at least partly taken over between the substrate table and the ejector element; and determining the optimum take over height for the ejector element from the determined reference height, wherein the reference height is determined based on quantifiable differences in force delivered by a short stroke actuator for keeping the substrate table positioned when the ejector element is moved between its unloaded and loaded state, during which movement a discontinuity occurs in the force delivered by the short stroke actuator during the part wherein the ejector element moves in its unloaded state, and the part wherein the ejector element moves in its loaded state, and wherein the discontinuity determines the reference height.

According to a further embodiment of the invention, there is provided a lithographic apparatus and calibration method for calibrating an optimum take over height of a substrate in such a lithographic apparatus between a substrate table and at least one ejector element which is moveable for loading and unloading the substrate from the substrate table, the method including: clamping the substrate on one of the substrate table and ejector element; moving the ejector element between an unloaded state wherein the substrate is supported by the substrate table and a loaded state wherein the substrate is at least partly supported by the ejector element; determining a reference height of the ejector element at the moment that the weight of the substrate is at least partly taken over between the substrate table and the ejector element; and determining the optimum take over height for the ejector element from the determine reference height, wherein the reference height is determined based on quantifiable differences in substrate deformation measurements which are performed when the ejector element is moved between its unloaded and loaded state, during which movement a discontinuity occurs in the deformation measurements during the part wherein the ejector element moves in its unloaded state, and the part wherein the ejector element moves in its loaded state, and wherein the discontinuity determines the reference height.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
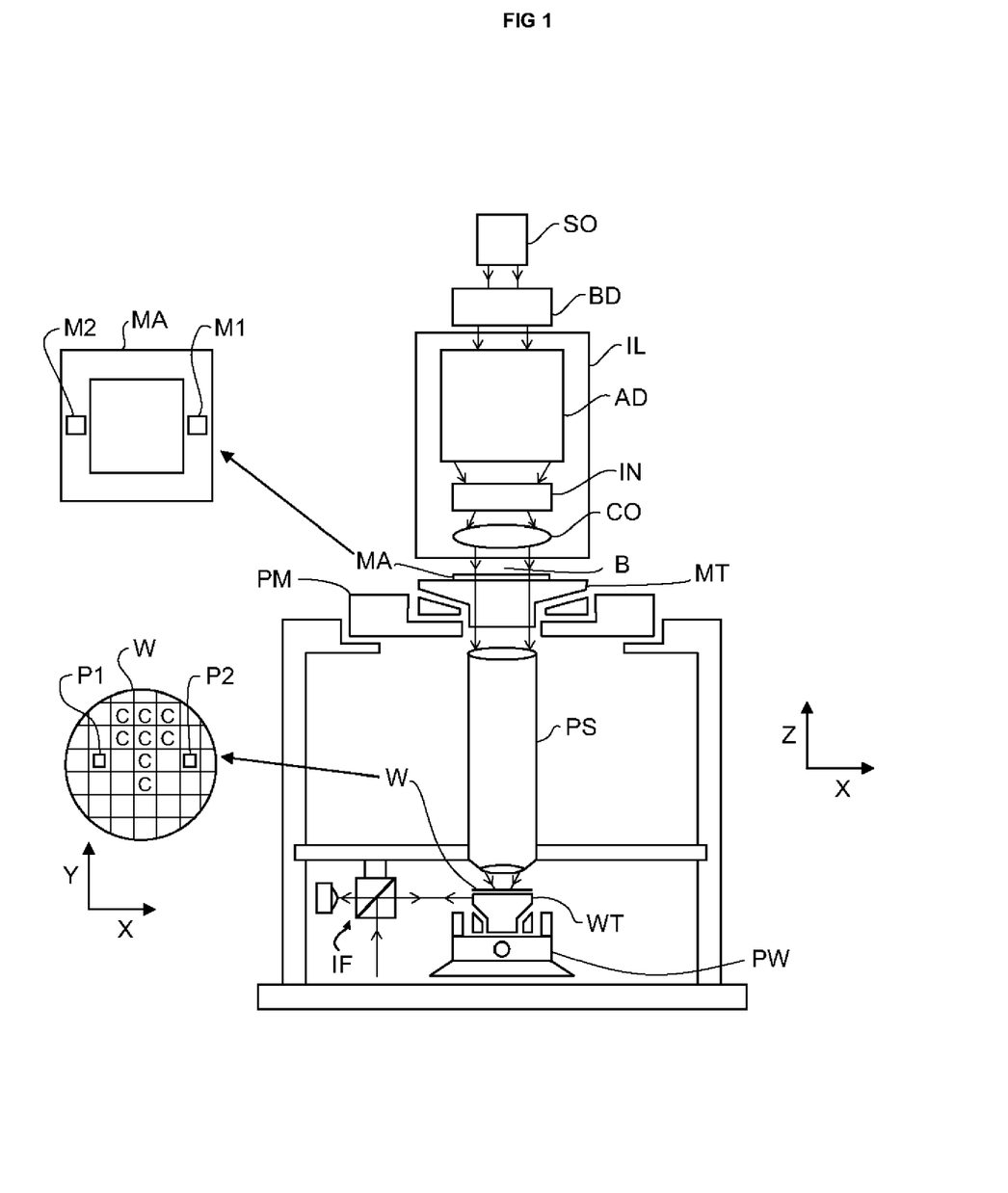
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support or mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desire the target portion of the substrate, for example if the pattern includes phase-shifting features or so called assist features. Generally, the pattern imparted to the radiation beam will correspond to a particular a functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having one or two (dual stage) or more substrate tables or "substrate supports" (and/or one or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases, the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the patterning device (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

The depicted apparatus could be used in at least one of the following modes:

1. In step mode, the patterning device support (e.g. mask table) MT or "mask support" and the substrate table WT or "substrate support" are kept essentially static while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the patterning device support (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the patterning device support (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2A:
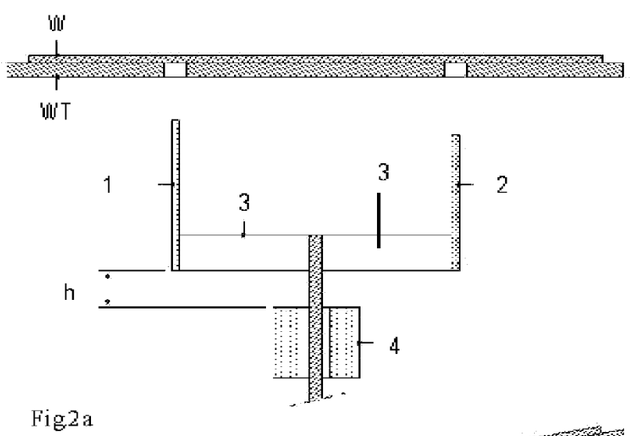
FIGS. 2a-g schematically show a tilt calibration measurement according to an embodiment of the invention for a first ejector pin using velocity differences in an actuator for the pins.

The substrate table WT is shown in an enlarged view in FIG. 2a, with the substrate W already clamped thereon, for example using a vacuum (e.g. provided by a vacuum pump). The table WT is supported on a chuck which forms part of the abovementioned second positioning device PW. The position in the Z-direction of the chuck and thus also of the table WT and substrate W clamped thereon, that is to say the direction perpendicular to the surface of the table WT, can accurately be controlled with three individually steerable short stroke Z-actuators which act in the Z-direction on the chuck. An assembly of three ejector pins is provided below the table WT, of which only a first ejector pin 1 and a second ejector pin 2 are shown here. The three pins are equally divided over the surface of the table WT and serve the purpose of loading and unloading a substrate W on the table WT. The pins are flexibly connected to each other with leaf springs 3 and thus form an assembly. An actuator 4 is provided which is configured to move the assembly of pins up or down. A height sensor is provided in the actuator 4, which is configured to detect the change in height h of the assembly of pins as a function of time t.

During a lithographic process, a new substrate W is to be loaded onto the table WT at the start of each scanning cycle. This is done by first moving the pins to a position in which they project out of the table WT and then place the substrate W on top of the pins. Subsequently, the pins are lowered until the substrate W is attracted by a vacuum device, or another suitable type of clamping, of the substrate table WT. A further lowering of the pins leads to the situation that the substrate W is fully supported and clamped onto the table WT, and no longer is supported by the pins. After the scanning operation has been performed, the pins are moved up again in order to unload the substrate W from the table WT.

In order to increase the robustness and repeatability of this substrate loading process and in order to reduce spread between respective chucks/positioning devices PW, embodiments of the present invention provide new methods on how the loading of the substrates can be calibrated more accurately.

An embodiment of a calibration method according to the invention is shown in FIGS. 2-4 which shall be dealt with step by step in more detail below.

Figure 2B:
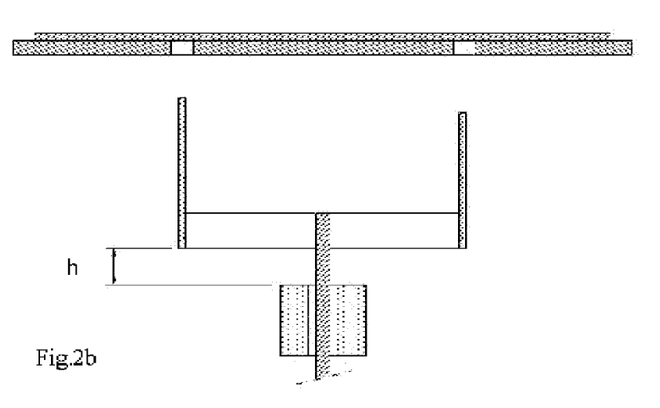
Figure 2C:
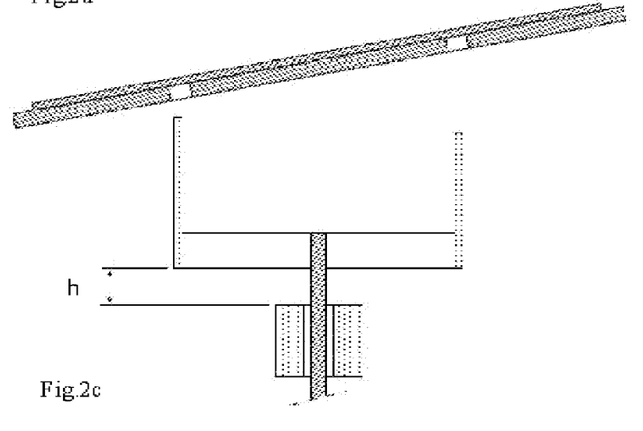
Figure 2D:
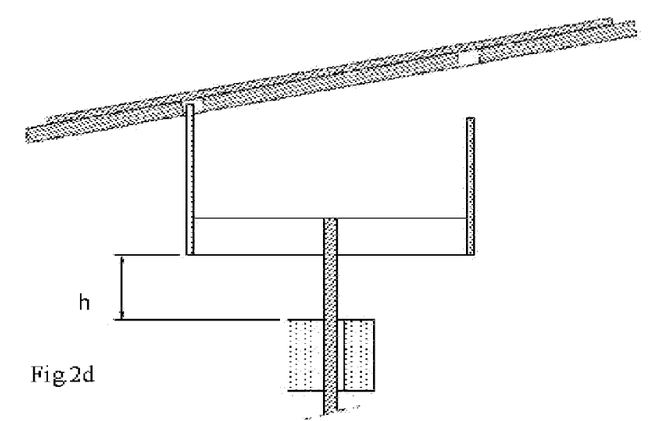
Figure 2E:
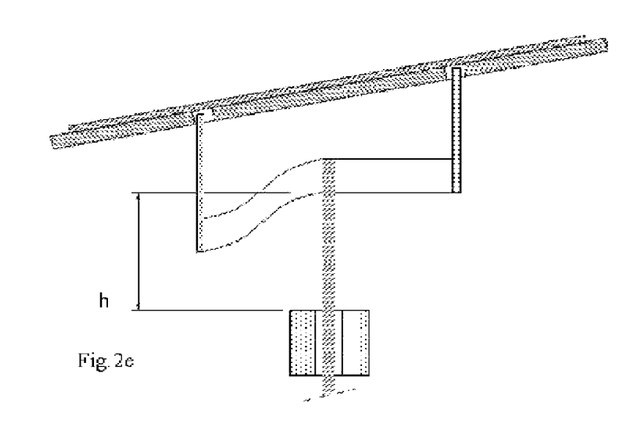
Figure 2F:
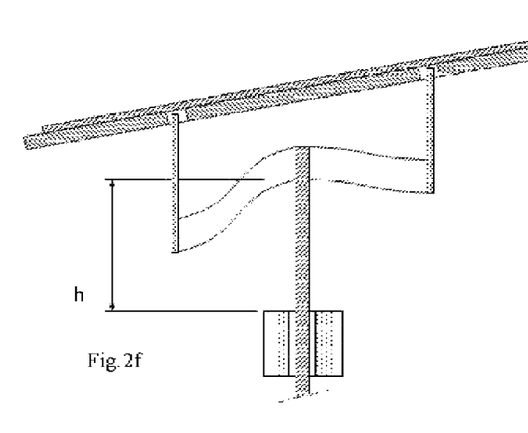

FIG. 2a shows a starting situation for an embodiment of a calibration process in which the substrate W is already preloaded and clamped on the table WT. As a first sub procedure of the calibration process, the actuator 4 together with the pins 1, 2 is moved to a certain predefined calibration begin height (FIG. 2b). Then, as a second sub procedure, the table WT together with the substrate W is (pre)tilted towards the first pin 1 (FIG. 2c). This tilt is achieved using a suitable driving of the Z-actuators of the chuck. Then, the pins 1, 2 together are moved upwards using a suitable upward driving of a central driving shaft 5 of the actuator 4. After some time during this upward movement, the pin 1 starts contacting the bottom side of the substrate W (FIG. 2d). After some more time also the pin 2 starts contacting the substrate W (FIG. 2e). Finally, a certain predefined calibration end height is reached by the shaft 5 of the actuator 4, at which point in time the upward driving movement of the actuator 4 is stopped (FIG. 2f). With this, the leaf springs 3 provide a certain degree of flexibility. This is needed because as soon as a pin starts contacting the substrate W, it is blocked from further upward movement since the substrate W is firmly clamped on the table WT and thus is able to withstand the further upward movement of this pin. Further actuating of the actuator 4, that is to say upward movement of the shaft 5 thereof, then results in a deformation of the leaf spring 3 of that pin.

Figure 2G:
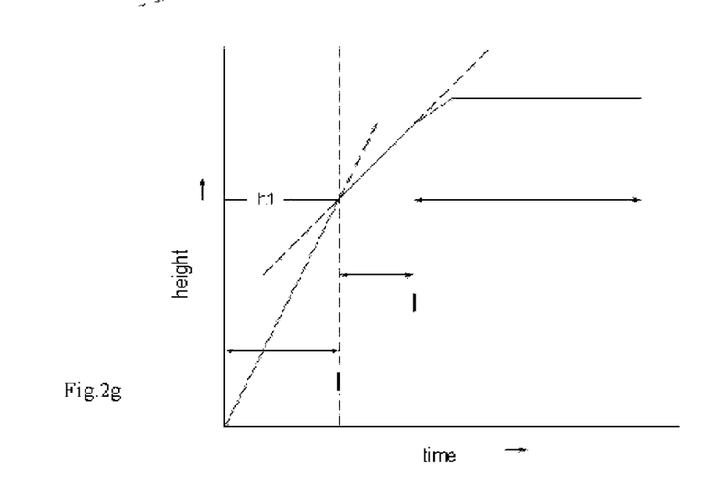

During the entire upward movement, the height h of the central shaft 5 for the assembly of pins 1, 2 is measured as a function of the time t. This is shown in the graph of FIG. 2g. Several linear parts are found in this graph. The slope of each linear part represents the velocity of the shaft 5 for the assembly of pins 1, 2 for that part of its moving stroke. From the velocity of each linear part it can be determined how many pins 1, 2 during that part of the stroke are in contact with the substrate W. This velocity is higher when none of the pins 1, 2 is in contact with the substrate W, and gets lower as soon as the first pin 1 contacts the substrate W. The discontinuity in these velocities makes it possible to find the height h1 of first contact between the pin 1 and the substrate W. Owing to the (pre)tilt that the table WT and substrate W have been given towards the pin 1, it is determined that it is this pin 1 that is the first to contact the substrate W during this first procedure of the calibration process.

Figure 3A:
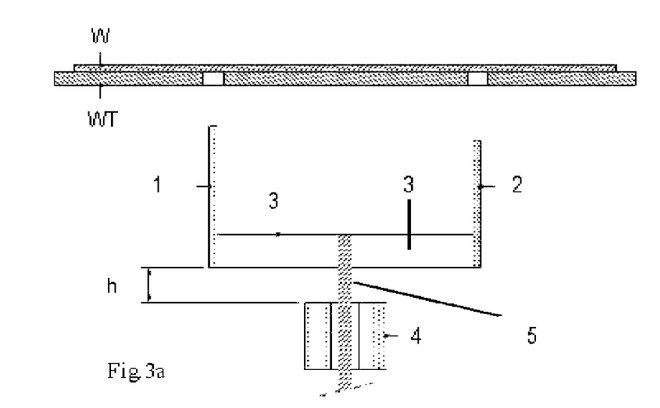
FIGS. 3a-g schematically show the tilt calibration measurement of FIG. 2 for a second ejector pin.
Figure 3B:
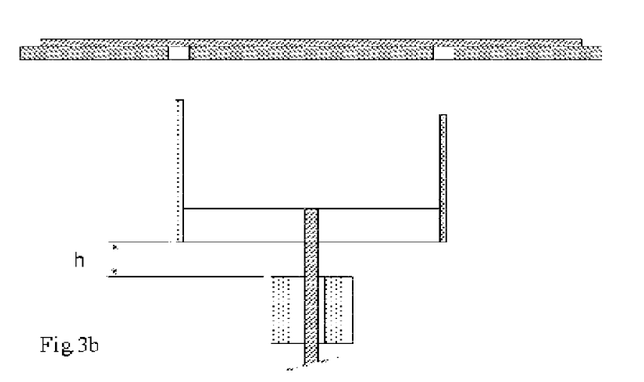
Figure 3C:
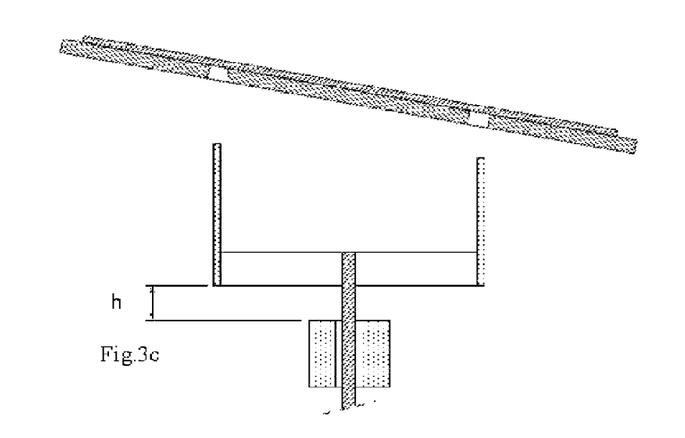
Figure 3D:
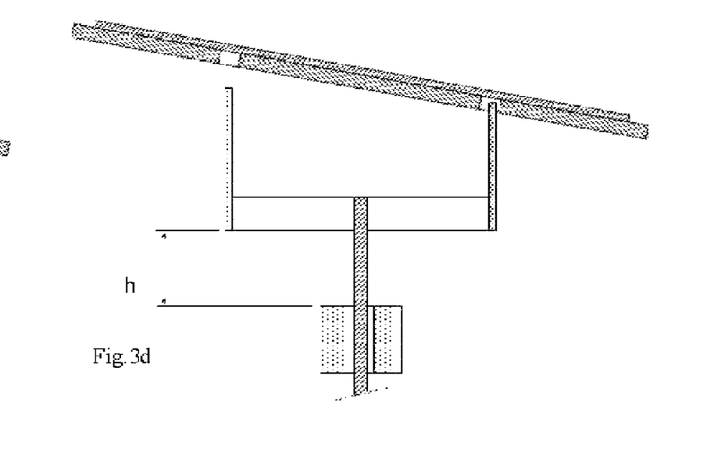
Figure 3E:
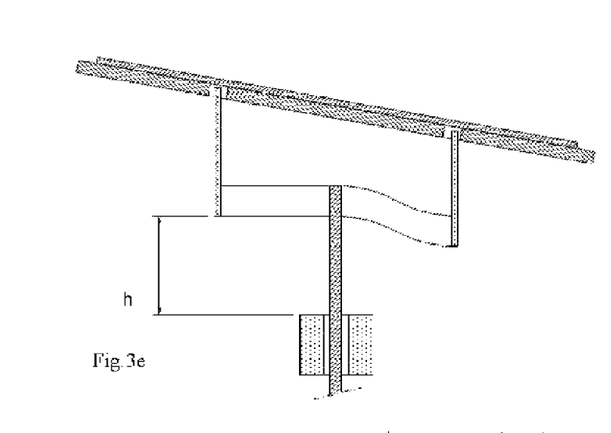
Figure 3F:
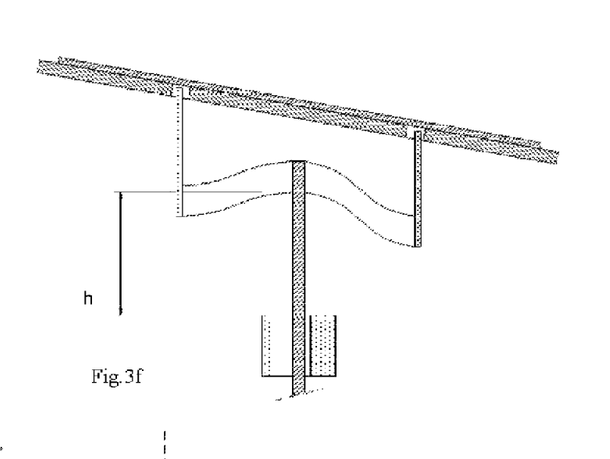

FIG. 3a-g show a second procedure of the calibration process, which includes the same sequence of sub procedures as shown in FIGS. 2a-g, but then in the situation that the table WT together with the substrate W is (pre)tilted towards the second pin 2 (FIG. 3c). In this way also a discontinuity in velocities can be detected making it able to find the height h2 of first contact between the pin 2 and the substrate W. Owing to the (pre)tilt that the table WT and substrate W now have been given towards the pin 2, it is determined that it is this pin 2 that is now the first to contact the substrate W.

Figure 4A:
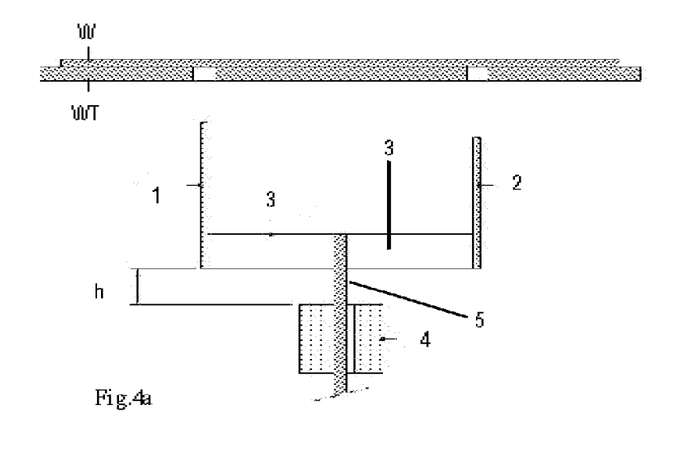
FIGS. 4a-f schematically show a height calibration measurement in a corrected tilted position both ejector pins at the same time.
Figure 4B:
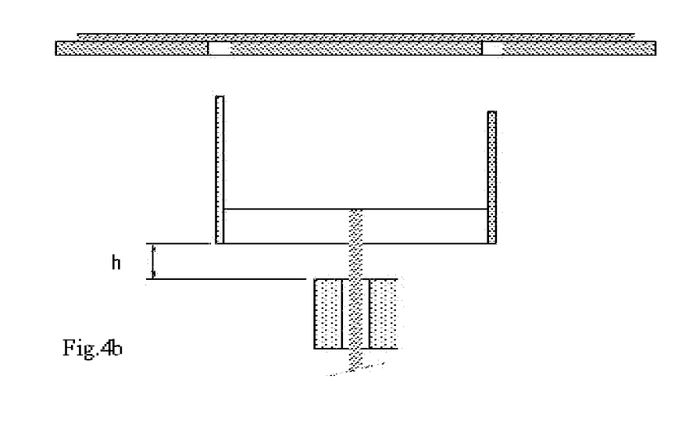
Figure 4C:
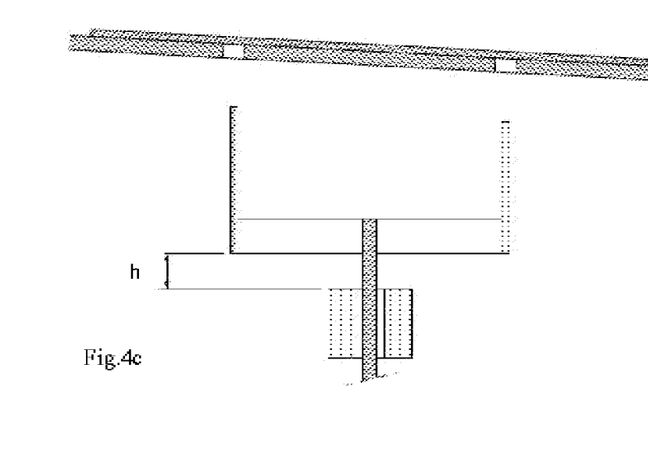
Figure 4D:
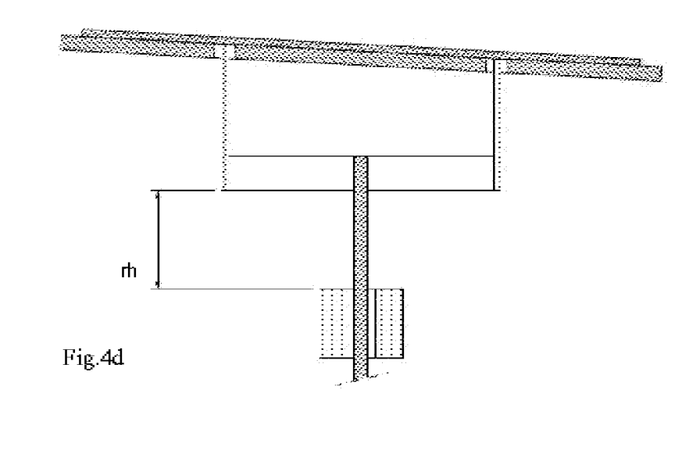
Figure 4E:
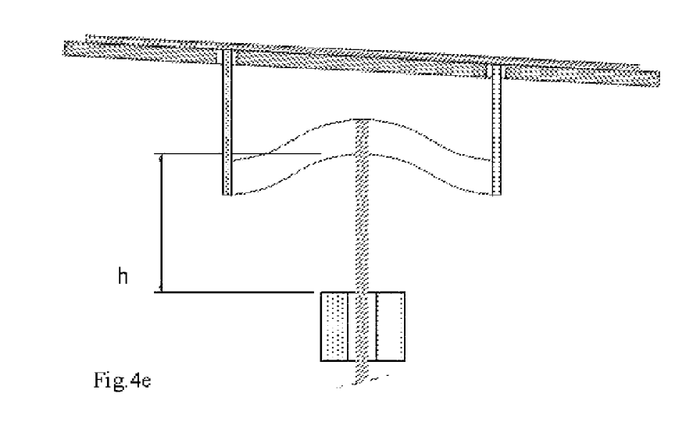

In a third procedure of the calibration process as shown in FIGS. 4a-f the thus measured heights h1, h2 are used to determine and correct for a tilt error of the pins 1, 2 relative to the table WT. This correction is shown in the sub procedure of FIG. 4c where the table WT and the substrate W have been given a calibrated (pre)tilt corresponding to the measured heights h1 and h2. After this calibrated tilt has been set for the table WT, the assembly of pins 1, 2 begins moving up again starting at the predefined calibration starting height (FIG. 4b). Owing to the already calibrated (pre)tilt, during this upward movement at some moment in time, both pins 1, 2 now are to contact the substrate W at the same time. Again the assembly of pins 1, 2 continues to move upwards until the predefined calibration end height has been reached (FIG. 4e). Again a discontinuity in velocities can be detected between the part of the stroke that the pins 1, 2 are unloaded and the part of the stroke that the pins 1,2 are loaded. This discontinuity makes it possible to find a reference height rh of the pins 1, 2 at the moment that the weight of the substrate W is just about to be and/or at least partly taken over from the substrate table WT towards the pins 1, 2. As a final procedure in the calibration process it is now possible to determine the optimum take over height for the pins 1, 2 by subtracting the found reference height rh with a certain predefined offset from the calibration starting height. This certain predefined offset is to be chosen by the operator and is dependent on at what precise moment the operator wants to consider the substrate as having been taken over between the substrate table and the pins. If this predefined offset is chosen to be zero, then the optimum take over height is considered by the operator to be the same as the determined reference height. However, the operator, for whatever reason, also has the freedom to choose the optimum take over height to be somewhat less or more than the determined reference height. For example, the moment for switching on the clamp, for example the vacuum, of the substrate table, might well be linked to the reaching of the optimum take over height, and for example might lie between about 0-0.3 mm. This has the effect that during a substrate loading process, the clamping device (broadly termed "clamp" hereinafter) of the substrate table, for example the vacuum forces, are switched on slightly prior to the moment that the substrate is no longer carried by the pins. This in turn has the benefit that the switching on of the clamp can be accurately timed and tuned relative to the moment of taking over the substrate between the pins and the table. Thus the clamp only has to be active when necessary. The clamp no longer has to be switched on prematurely (which would have the risk of the substrate being attracted to the substrate table too early while still being supported on the pins at a relative large height relative to the substrate table, and which would have the effect of loss of unused clamping forces), and they are not switched on too late (which would have the risk of the substrate moving relative to the substrate table as long as the clamp is not active while the substrate is already fully supported on the table).

Figure 3G:
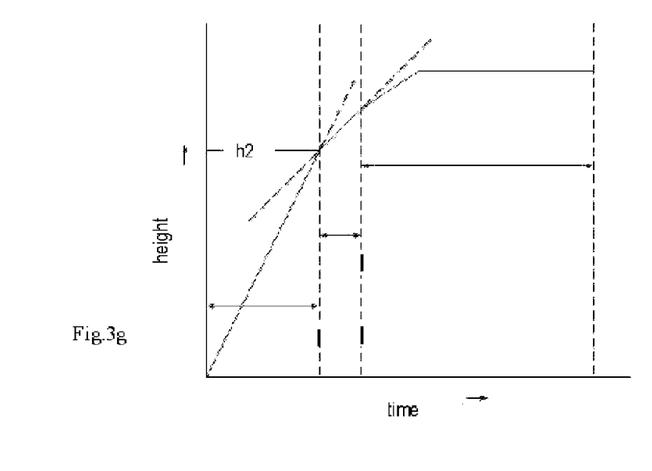
Figure 4F:
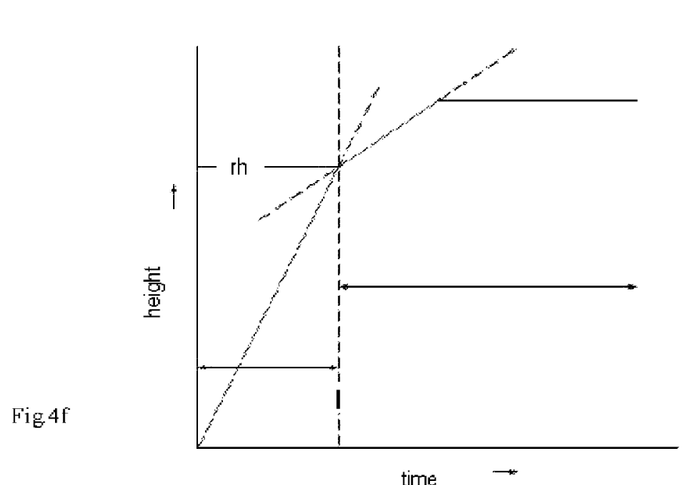

As can be seen in the FIGS. 2g, 3g and 4f more than one discontinuity appears in the graphs during the upward movements of the assembly of pins. Each time an extra pin starts contacting the substrate, the velocity is lowered stepwise and a discontinuity appears in the graph. In fact, it is even possible to determine from the velocity at each linear part of the graph how many pins at that moment are actually in contact with the substrate. This can be used to find an optimal tilt, for example by performing several calibrations for several differ (pre)tilts of the table.

Figure 5:
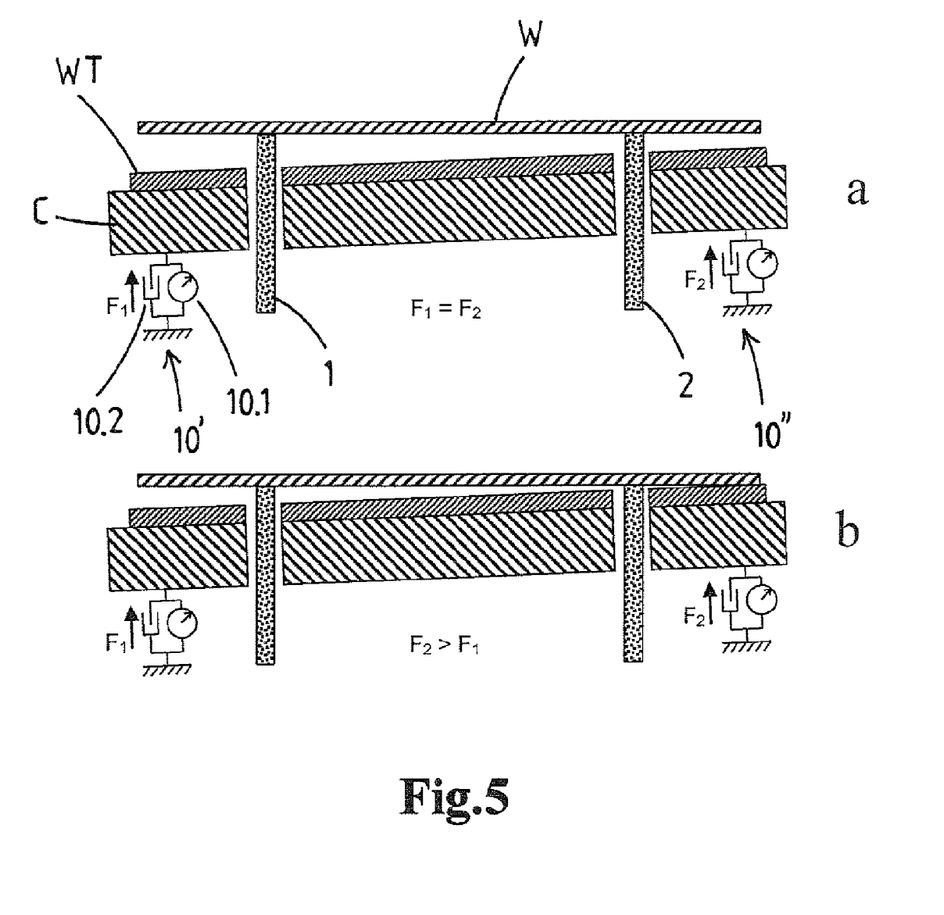
FIGS. 5a-b show an alternative embodiment for the calibration method using discontinuities of Z-actuators.

In FIGS. 5a-b, an alternative embodiment is shown in which the above described calibration process is now based upon a tracing of the short stroke Z-actuators for the chuck during a moving of the pins from a loaded towards an unloaded state or vice versa. FIG. 5a shows the situation that the substrate W is fully supported by the pins 1, 2 at a certain height above the table WT. The chuck C is shown as being supported by the short stroke Z-actuators 10 (of which only two have been shown). Each short stroke Z-actuator 10 includes an actuating part 10.1 and a sensor part 10.2. The first short stroke Z-actuator 10' delivers a force F1, whereas the second short stroke Z-actuator 10" delivers a force F2 in order to keep the chuck and the substrate table properly supported in the right position. In the situation of FIG. 5a, these forces F1, F2 delivered by the respective Z-actuators 10', 10" are substantially equal to one another. However, when the pins 1, 2 together with the substrate W are subsequently lowered as a first procedure of the calibration process, then a situation as shown in FIG. 5b may arise, that is to say a situation in which the weight of the substrate W starts to be taken over by the table WT. The substrate W is then still fully supported on the pin 1, but only partly supported on the pin 2 and partly on the table WT. The moment that this situation of FIG. 5b arises can immediately be detected as a discontinuity in the outgoing force data of the sensor part 10.2 of the Z-actuator 10". F1 is supposed to at least temporarily become smaller than F2. This discontinuity provides a measured height h1. By further lowering the pins 1, 2 and substrate W the moment arises that the substrate W is also taken over from the pin 2 by the table WT. This can be detected as a discontinuity in the outgoing force data of the Z-actuator 10', and provides for a measured height h2. Furthermore, from the difference in timings between each of the (three) Z-actuators 10 it can be seen how the substrate W was tilted relative to the table W or pins 1, 2. This tilt can then be corrected (calibrated). In a next procedure of the calibration process, the thus measured heights h1, h2 are used to determine and correct for a tilt error of the pins 1, 2 relative to the table WT, and at the same time determine the optimum take over heights of the pins 1, 2.

Figure 6:
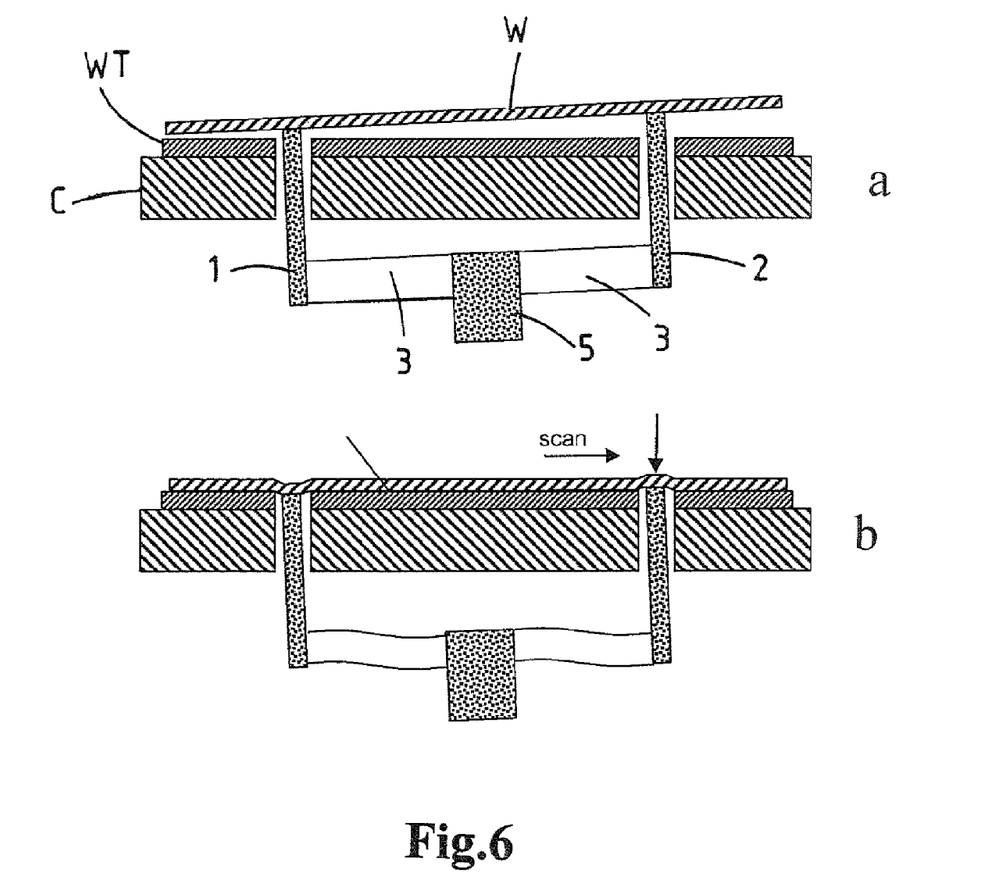
FIGS. 6a-b show an alternative embodiment for the calibration method using discontinuities of a substrate deformation.

In a further embodiment the calibration is based upon measuring substrate unflatness during a moving of the pins from a loaded towards an unloaded state or vice versa. A movement from an unloaded state towards a loaded state is shown as an example in FIGS. 6a-b. FIG. 6a shows the situation in which the substrate W is supported on the pins 1, 2 at a slight distance above the table WT. By subsequently activating a clamp of the table WT, the substrate is clamped onto the table WT. In this loaded state, the pins 1, 2 still exercise forces on the clamped substrate W. This will result in local substrate deformation as shown in FIG. 6b which can be detected. This local deformation may be caused by the pins extending slightly above the table WT (as shown for the pin 2), and/or by the pins also acting a clamping force on the substrate W while extending somewhat below the surface of the table WT (as shown for the pin 1). With this the absolute deformation values may be measured. From Finite Element Method (FEM), it may be calculated that a particular force of a particular pin 1, 2, for example 5 mN pin force, would result in a particular local substrate deformation at the position of that pin 1, 2, for example 10 nm local substrate deflection. The stiffness of the leaf spring 3 of the pins 1, 2 may also be known, and for example lie around 5e3 N/m. This way it is possible to determine a certain amount of height offset of a particular pin 1, 2. From the difference in offset of the individual pins 1, 2 it can also be seen how the substrate was tilted. This tilt can then be corrected. In the alternative, it is also possible to detect the moment a deformation of the substrate W starts or ends as a discontinuity in time. This discontinuity then may be indicative for the moment the substrate W was taken over by the table WT from the pins 1, 2 or vice versa, and thus an optimal take over height and/or tilt can be determined there from.

Although not shown in the various figures, it is noted that, preferably, the described tilt and height calibration are not only performed for the pins 1, 2, but also include measurements for the not shown third pin.

Thus with this method it is possible to accurately calibrate both the tilt and the optimum take over height for the entire set of pins. It will be appreciated that the calibration method according to an embodiment of the invention is more accurate than the state of the art calibration method. This is beneficial because it makes the overlay more robust, i.e. less spread in overlay between different chucks regarding substrate load. Also it has the benefit of less spread in loading and unloading time for the substrates. The calibration method according to an embodiment of the invention is relatively inexpensive to incorporate and can easily be built in existing lithographic apparatus. No hardware changes are needed; it only requires some additional software to do the calibration.

Besides the embodiment shown numerous, it will be appreciated that variants are possible. For example, combinations may be made between the various embodiments. Instead of determining the quantifiable velocity differences or other types of discontinuities, during an upward vertical movement of the pins from their unloaded state towards their loaded state, it is also possible to detect such discontinuities during a movement of the pins from a loaded towards an unloaded state, or vice versa. Performing the calibration method during an upward movement of the pins from an unloaded towards a loaded state however is beneficial because no deformation correction needs to take place and tilt is easier to determine. Furthermore, it is noted that during the calibration method it is beneficial if the substrate is firmly clamped onto the table, because otherwise the substrate may get displaced during the taking over. Instead of calibrating the relative position of a set of pins with respect to a substrate table, it is also possible to perform this calibration method for other types and/or numbers of ejector elements. If desired it is also possible to only determine a tilt calibration and/or to only perform a calibration for determining an optimum take over height.

In another variant, during a calibration process, the substrate can as a first precedure be (pre)clamped on the pins in a position wherein these pins project at a certain calibration starting height above the table. By then lowering the pins together with substrate clamped thereon towards a certain predefined calibration end height of the pins somewhat below the table, it is also possible to detect a discontinuity in the velocity pattern of the assembly of pins and deduct this discontinuity towards optimized calibration tilt and take over height of the table relative to the pins.

Furthermore it is also possible to provide each pin with a separate actuator having its own height sensor, and no longer flexibly connect the pins with each other as an assembly. In this case the tilt alignment is easier because each pin can be actuated and calibrated separately. This makes it possible to calibrate for the optimum take over height and tilt at the same time.

In yet another embodiment external height sensors, for example level sensors or sensors directly acting on the pins, are provided, which make it possible to directly measure the height of the substrate during a moving of the pins from a loaded towards an unloaded state or vice versa. This way, it is possible to directly measure the individual pin height, for which the substrate touches the table or for which the pins start contacting the substrate. In a further variant it is then also possible to measure a tilt of the pins relative to the table, by lifting substrate slightly above the table and then slowly move the chuck around in XY. Next the substrate is loaded and the tilt can be measured again. Instead of lifting the substrate slightly above the table, it is also possible to directly measure the top of the pins. Then the calibration can even be performed without a substrate being present. By providing more height sensors, XY movement is not even necessary. The calibration method may also include a moving of the chuck a couple of times and each time perform the measurements again. In that case one single height sensor might suffice.

Although specific reference may be made in this text to the use of lithographic apparatus in the manufacture of ICs, it should be understood that the lithographic apparatus 1 described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A calibration method for calibrating an optimum take over height of a substrate in a lithographic apparatus between a substrate table and at least one ejector element which is moveable to load and unload the substrate on and from the substrate table, the method comprising:
    clamping the substrate on the substrate table;
    moving the ejector element between an unloaded state wherein the substrate is supported by the substrate table and a loaded state wherein the substrate is at least partly supported by the ejector element;
    determining a reference height of the ejector element when the weight of the substrate is at least partly taken over by the ejector element; and
    determining an optimum take over height for the ejector element from the determined reference height,
    wherein the reference height is determined based on a quantifiable difference in velocity of the ejector element when moved between the unloaded and loaded state, during which movement the ejector element partly moves with a first velocity in the unloaded state, and partly moves with a second velocity in the loaded state, and
    wherein a discontinuity between the first and the second velocity is used to determine the reference height.

2. The calibration method of claim 1, wherein prior to moving the ejector element between the unloaded and loaded state, the substrate is loaded on the substrate table by (a) placing the substrate on the ejector element, (b) lowering the ejector element until the substrate is attracted by a clamp of the substrate table and (c) then lowering the ejector element until the substrate is supported and clamped onto the substrate table, and
    wherein the quantifiable velocity difference is determined during a subsequent upward vertical movement of the ejector element from its unloaded state towards its loaded state.

3. The calibration method of claim 1, wherein at least two vertically moveable ejector elements are provided, and wherein the reference height is determined for each ejector element.

4. The calibration method of claim 3, wherein a tilt calibration for determining the optimum take over tilt for the at least two ejector elements is performed by mutually comparing the determined reference heights of the at least two vertically moveable ejector elements.

5. The calibration method of claim 4, wherein prior to determining the reference height of a first one of the at least two ejector elements, the substrate table is tilted towards said first one of the ejector elements such that said first one of the at least two ejector elements contacts the substrate first when subsequently moved between the unloaded and loaded state, and wherein prior to determining the reference height of a second one of the at least two ejector elements, the substrate table is tilted towards said second one of the at least two ejector elements such that said second one of the at least two ejector elements contacts the substrate first when subsequently moved between the unloaded and loaded state.

6. The calibration method of claim 3, wherein the at least two ejector elements are flexibly connected with one another and are vertically moved together with a common drive.

7. A calibration method for calibrating an optimum take over height of a substrate in a lithographic apparatus between a substrate table and at least one ejector element which is moveable for loading and unloading the substrate on and from the substrate table, the method comprising:

clamping the substrate on the substrate table;
moving the ejector element between an unloaded state wherein the substrate is supported by the substrate table and a loaded state wherein the substrate is at least partly supported by the ejector element;
determining a reference height of the ejector element when the weight of the substrate is at least partly taken over by the ejector element; and
determining the optimum take over height for the ejector element from the determined reference height,
wherein the reference height is determined based on a quantifiable difference in force delivered by a short stroke actuator configured to keep the substrate table positioned in a position when the ejector element is moved between the unloaded and loaded state, during which movement a discontinuity occurs in the force delivered by the short stroke actuator between a phase wherein the ejector element moves in the unloaded state, and a phase wherein the ejector element moves in the loaded state, and
wherein the discontinuity is used to determine the reference height.

8. The calibration method of claim 7, wherein prior to moving the ejector element between the unloaded and loaded state, the substrate is loaded on the substrate table by (a) placing the substrate on the ejector element, (b) lowering the ejector element until the substrate is attracted by a clamp of the substrate table and (c) then lowering the ejector element until the substrate is supported and clamped onto the substrate table, and wherein the quantifiable force difference is determined during a subsequent upward vertical movement of the ejector element from its unloaded state towards its loaded state.

9. The calibration method of claim 7, wherein at least two vertically moveable ejector elements are provided, and wherein for each ejector element individually the reference height is determined.

10. The calibration method of claim 9, wherein a tilt calibration for determining the optimum take over tilt for the at least two ejector elements is performed by mutual comparison of the determined individual reference heights of the respective ejector elements.

11. The calibration method of claim 10, wherein prior to determining the reference height of a first one of the at least two ejector elements, the substrate table is tilted towards said first one of the at least two ejector elements such that said first one of the at least two ejector elements contacts the substrate first when subsequently moved between the unloaded and loaded state, and wherein prior to determining the reference height of a second one of the at least two ejector elements, the substrate table is tilted towards said second one of the at least two ejector elements such that said second one of the at least two ejector elements contacts the substrate first when subsequently moved between the unloaded and loaded state.

12. The calibration method of claim 9, wherein the at least two ejector elements are flexibly connected with one another and are vertically moved together with a common drive.

13. A calibration method for calibrating an optimum take over height of a substrate in a lithographic apparatus between a substrate table and at least one ejector element which is moveable for loading and unloading the substrate on and from the substrate table, the method comprising:

clamping the substrate on the substrate table;
moving the ejector element between an unloaded state wherein the substrate is supported by the substrate table and a loaded state wherein the substrate is at least partly supported by the ejector element;
determining a reference height of the ejector element when the weight of the substrate is at least partly taken over by the ejector element; and
determining the optimum take over height for the ejector element from the determined reference height,
wherein the reference height is determined based on a quantifiable difference in a substrate deformation measurement which is performed when the ejector element is moved between the unloaded and loaded state, during which movement a discontinuity occurs in the deformation measurement during a phase wherein the ejector element moves in the unloaded state, and a phase wherein the ejector element moves in the loaded state, and
wherein the discontinuity is used to determine the reference height.

14. The calibration method of claim 13, wherein prior to moving the ejector element between the unloaded and loaded state, the substrate is loaded on the substrate table by (a) placing the substrate on the ejector element, (b) lowering the ejector element until the substrate is attracted by a clamp of the substrate table and (c) then lowering the ejector element until the substrate is supported and clamped onto the substrate table, and wherein the quantifiable deformation difference is determined during a subsequent upward vertical movement of the ejector element from the unloaded state towards the loaded state.

15. The calibration method of claim 13, wherein at least two vertically moveable ejector elements are provided, and wherein for each ejector element individually the reference height is determined.

16. The calibration method of claim 15, wherein a tilt calibration for determining the optimum take over tilt for the at least two ejector elements is performed by mutual comparison of the determined individual reference heights of the respective ejector elements.

17. The calibration method of claim 15, wherein the at least two ejector elements are flexibly connected with one another and are vertically moved together with a common drive.

18. A lithographic apparatus comprising:
an illumination system configured to condition a radiation beam;

a support constructed to support a patterning device, the patterning device being capable of imparting the radiation beam with a pattern in its cross-section to form a patterned radiation beam;

a substrate table constructed to hold a substrate, the substrate table comprising at least one ejector element configured to lower and lift the substrate with respect to the substrate table;

a projection system configured to project the patterned radiation beam onto a target portion of the substrate; and a control system configured to calibrate an optimum take over height of the substrate between the substrate table and the at least one ejector element which is moveable to load and unload the substrate on and from the substrate table, by clamping the substrate on the substrate table;

moving the at least one ejector element between an unloaded state wherein the substrate is supported by the substrate table and a loaded state wherein the substrate is at least partly supported by the ejector element;

determining a reference height of the ejector element when the weight of the substrate is at least partly taken over by the ejector element; and determining an optimum take over height for the ejector element from the determined reference height, wherein the reference height is determined based on a quantifiable difference in velocity of the ejector element when moved between the unloaded and loaded state, during which movement the ejector element partly moves with a first velocity in the unloaded state, and partly moves with a second velocity in the loaded state, and wherein a discontinuity between the first and second velocity is used to determine the reference height.

19. A lithographic apparatus comprising:

an illumination system configured to condition a radiation beam;

a support constructed to support a patterning device, the patterning device being capable of imparting the radiation beam with a pattern in its cross-section to form a patterned radiation beam;

a substrate table constructed to hold a substrate, the substrate table comprising at least one ejector element configured to lower and lift the substrate with respect to the substrate table;

a projection system configured to project the patterned radiation beam onto a target portion of the substrate; and a control system configured to calibrate an optimum take over height of the substrate between a substrate table and the at least one ejector element which is moveable for loading and unloading the substrate on and from the substrate table, by clamping the substrate on the substrate table;

moving the at least one ejector element between an unloaded state wherein the substrate is supported by the substrate table and a loaded state wherein the substrate is at least partly supported by the ejector element;

determining a reference height of the ejector element when the weight of the substrate is at least partly taken over by the ejector element; and determining the optimum take over height for the ejector element from the determined reference height, wherein the reference height is determined based on a quantifiable difference in force delivered by a short stroke actuator configured to keep the substrate table positioned in a position when the ejector element is moved between the unloaded and loaded state, during which movement a discontinuity occurs in the force delivered by the short stroke actuator during a phase wherein the ejector element moves in the unloaded state, and a phase wherein the ejector element moves in the loaded state, and wherein the discontinuity is used to determine the reference height.

20. A lithographic apparatus comprising:

an illumination system configured to condition a radiation beam;

a support constructed to support a patterning device, the patterning device being capable of imparting the radiation beam with a pattern in its cross-section to form a patterned radiation beam;

a substrate table constructed to hold a substrate, the substrate table comprising at least one ejector element configured to lower and lift the substrate with respect to the substrate table; and a projection system configured to project the patterned radiation beam onto a target portion of the substrate; and a control system configured to calibrate an optimum take over height of a substrate in a lithographic apparatus between a substrate table and the at least one ejector element which is moveable for loading and unloading the substrate on and from the substrate table, by clamping the substrate on the substrate table;

moving the at least one ejector element between an unloaded state wherein the substrate is supported by the substrate table and a loaded state wherein the substrate is at least partly supported by the ejector element;

determining a reference height of the ejector element when the weight of the substrate is at least partly taken over by the ejector element; and determining the optimum take over height for the ejector element from the determined reference height, wherein the reference height is determined based on a quantifiable difference in a substrate deformation measurement which is performed when the ejector element is moved between the unloaded and loaded state, during which movement a discontinuity occurs in the deformation measurement during a phase wherein the ejector element moves in the unloaded state, and a phase wherein the ejector element moves in the loaded state, and wherein the discontinuity is used to determine the reference height.

* * * * *